US011970076B2

(12) United States Patent
Sarfert et al.

(10) Patent No.: US 11,970,076 B2
(45) Date of Patent: Apr. 30, 2024

(54) METHOD FOR OPERATING AN ELECTRICAL ENERGY STORE

(71) Applicant: Robert Bosch GmbH, Stuttgart (DE)

(72) Inventors: Christel Sarfert, Korntal-Muenchingen (DE); Christoph Kroener, Rosstal (DE); Jens Becker, Benningen Am Neckar (DE); Joerg Poehler, Korntal-Muenchingen (DE)

(73) Assignee: Robert Bosch GmbH, Stuttgart (DE)

( * ) Notice: Subject to any disclaimer, the term of this patent is extended or adjusted under 35 U.S.C. 154(b) by 205 days.

(21) Appl. No.: 17/311,438

(22) PCT Filed: Dec. 3, 2019

(86) PCT No.: PCT/EP2019/083444
§ 371 (c)(1),
(2) Date: Jun. 7, 2021

(87) PCT Pub. No.: WO2020/115027
PCT Pub. Date: Jun. 11, 2020

(65) Prior Publication Data
US 2022/0024343 A1 Jan. 27, 2022

(30) Foreign Application Priority Data
Dec. 5, 2018 (DE) ...................... 10 2018 220 981.2

(51) Int. Cl.
*H02J 7/00* (2006.01)
*B60L 58/10* (2019.01)
(Continued)

(52) U.S. Cl.
CPC ............... *B60L 58/12* (2019.02); *B60L 58/10* (2019.02); *B60L 58/25* (2019.02); *B60R 16/033* (2013.01);
(Continued)

(58) Field of Classification Search
CPC .... B60L 58/10; B60L 58/12; B60L 58/24–25; B60R 16/033; G01R 31/3842; G06N 3/02; G06N 7/046
(Continued)

(56) References Cited

U.S. PATENT DOCUMENTS

2010/0247988 A1* 9/2010 Okumura ................ B60L 58/14
320/128
2015/0251555 A1* 9/2015 Li ........................... B60L 58/21
701/22
(Continued)

FOREIGN PATENT DOCUMENTS

| CN | 104898063 A | 9/2015 |
|---|---|---|
| CN | 105667464 A | 6/2016 |

(Continued)

OTHER PUBLICATIONS

Translation of International Search Report for Application No. PCT/EP2019/083444 dated Mar. 3, 2020 (2 pages).
(Continued)

*Primary Examiner* — Zixuan Zhou
(74) *Attorney, Agent, or Firm* — Michael Best & Friedrich LLP

(57) ABSTRACT

A method, device, and computer-readable medium for operating an electrical energy store is provided. The electrical energy store includes a storage cell for storing electrical energy and a control unit. State variables of the electrical energy store are detected. The state variables are transmitted to a computation unit outside of the electrical energy store. The electrical energy store is operated based on operating parameters provided by the computation unit.

10 Claims, 2 Drawing Sheets

(51) Int. Cl.
  *B60L 58/12* (2019.01)
  *B60L 58/25* (2019.01)
  *B60R 16/033* (2006.01)
  *G01R 31/3842* (2019.01)
  *B60L 58/24* (2019.01)
  *G06N 3/02* (2006.01)
  *G06N 7/04* (2006.01)

(52) U.S. Cl.
  CPC .......... *G01R 31/3842* (2019.01); *B60L 58/24* (2019.02); *G06N 3/02* (2013.01); *G06N 7/046* (2013.01)

(58) Field of Classification Search
  USPC ............................................ 320/109; 701/22

See application file for complete search history.

(56) References Cited

U.S. PATENT DOCUMENTS

| | | |
|---|---|---|
| 2015/0345962 A1 | 12/2015 | Graham |
| 2018/0194238 A1 | 7/2018 | Tsuchiya |

FOREIGN PATENT DOCUMENTS

| | | | |
|---|---|---|---|
| CN | 106471698 A | 3/2017 | |
| CN | 106671785 A * | 5/2017 | ............ B60L 3/0046 |
| DE | 102015203803 A1 | 9/2015 | |
| DE | 102017103348 A1 | 8/2018 | |
| EP | 3309892 A1 | 4/2018 | |

OTHER PUBLICATIONS

Waag et al., "Critical Review of the methods for monitoring of lithium-ion batteries in electric and hybrid vehicles", Journal of Power Sources, 2014, vol. 258, pp. 321-339.

* cited by examiner

METHOD FOR OPERATING AN ELECTRICAL ENERGY STORE

BACKGROUND OF THE INVENTION

Electrical energy stores, for example batteries, as are used in electric vehicles, usually comprise a storage cell and a control unit, which is also referred to as battery management system (BMS). For the operation of the battery, knowledge or at least an assumption about various operating parameters of the battery is usually necessary. For example, the internal resistance of the battery forms an input variable for various operating situations such as, for example, a rapid charging strategy or the identification of a state of charge of the battery.

Methods for operating an electrical energy store in which operating parameters such as, for example, the electrical internal resistance of the battery are estimated by the BMS are known from the market. For this purpose, the BMS usually assumes that the battery behaves like a comparative battery, for which there are extensive laboratory tests, and estimates the operating parameters accordingly. For this purpose, the BMS usually acquires data during production, wherein updating of the data or individualization to the specific battery is not provided. If the estimation of the operating parameters by the BMS comprises complex algorithms, corresponding computation power within the BMS is necessary for this.

SUMMARY OF THE INVENTION

The method according to the invention for operating an electrical energy store, which comprises a storage cell for storing electrical energy and a control unit, wherein the control unit is configured to detect state variables of the electrical energy store, in contrast has the advantage that state variables detected by the control unit are transmitted to a computation unit outside of the electrical energy store, and that the electrical energy store is operated based on operating parameters provided by the computation unit. The provision of operating parameters by the computation unit has the advantage, in particular, that the control unit of the electrical energy store has to provide less computation power and therefore, for example, a microcontroller that is more favorable compared to the prior art can be used in the control unit.

It is advantageous that the operating parameters provided by the computation unit are determined using the state variables detected by the control unit. In other words, the determination of the operating parameters by the control unit can therefore advantageously be transferred to the computation unit.

It is advantageous that the operating parameters are identified using models, wherein the models are suitable for identifying estimated state variables of the electrical energy store from the detected state variables of the electrical energy store and the operating parameters are identified proceeding from the estimated state variables. In this case, state variables are to be understood, in particular, as those physical variables that can be detected by means of a suitable sensor system in or at the electrical energy store, such as a temperature, a current, a voltage or an electrical charge, for example. Estimated state variables are those physical variables that also describe the state of the electrical energy store but have not been detected by means of a sensor system directly at the electrical energy store but instead have been estimated proceeding from the detected state variables. Operating parameters are, in particular, physical variables that are used as input variable for the operation of the electrical energy store, for example the internal resistance of the electrical energy store. In an advantageous configuration, the operating parameters are themselves estimated state variables.

It is advantageous that the operating parameters provided by the computation unit are identified by means of neural networks. It is therefore possible, in particular, to identify the operating parameters or estimated state variables with a high degree of accuracy and in the process to advantageously utilize the computation power usually provided by the computation unit, which may be a cloud, for example.

It is advantageous that the electrical energy store is located in a vehicle and a connection between the control unit and the cloud is effected via a wireless communication module. In this case, the wireless communication module may be, in particular, a modem, for example a GSM modem.

It is advantageous that the control unit stores values of the operating parameters provided by the cloud and uses these to operate the electrical energy store until updated values of the operating parameters are available from the cloud. The operating parameters for operating the electrical energy store usually change on a slow timescale, in particular when the operating parameters are estimated state variables or variables derived directly from the estimated state variables. Therefore, it is not necessary on short timescales to update the operating parameters used to operate the electrical energy store. By storing the currently used operating parameters, data traffic between the wireless communication module and the cloud can therefore advantageously be reduced. It is particularly advantageous that an increased robustness with respect to an interruption of the connection between the wireless communication module and the cloud can be ensured in this way.

A device, which is configured to carry out each step of the method according to the invention, is advantageous. A computer program, which is configured to carry out each step of the method according to the invention when the computer program is executed on a computation unit, is also advantageous.

An electrical energy store, which comprises the device according to the invention, and a vehicle, which comprises the device according to the invention, are also advantageous.

BRIEF DESCRIPTION OF THE DRAWINGS

An exemplary embodiment of the invention is presented in more detail below. In this case.

DETAILED DESCRIPTION

Figure 1:
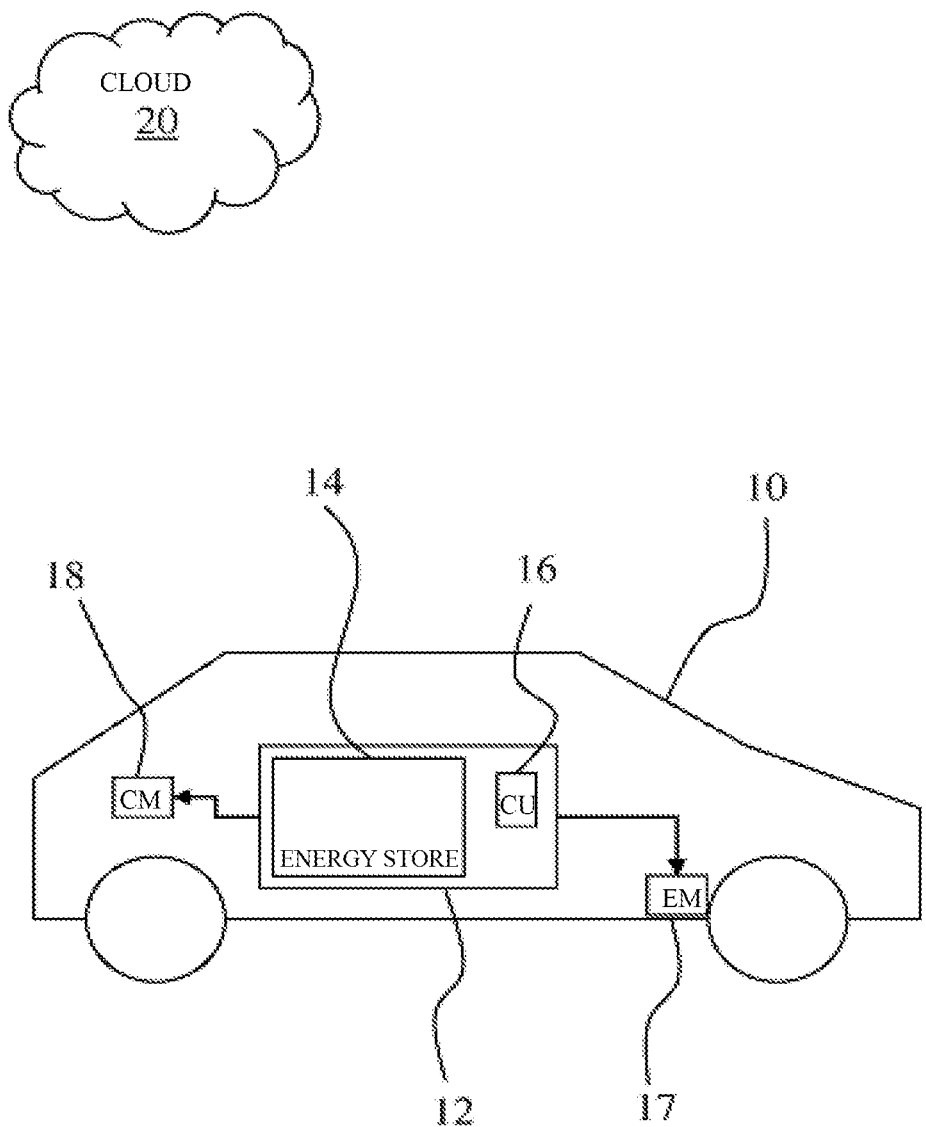
FIG. 1 shows a schematic illustration of a vehicle having an electrical energy store.

FIG. 1 shows a schematic illustration of a vehicle (10), which comprises an electrical energy store (12), a wireless communication module (18) and an electric motor (17). The electrical energy store (12) provides electrical energy to operate the electric motor (17). The electrical energy store (12) is connected to the wireless communication module (18) via a signal line. The electrical energy store (12) comprises a storage cell (14) and a control unit (16), which may be, in particular, a battery management system (BMS). The wireless communication module (18) is configured to establish a connection with a cloud (20), which represents a computation unit. In an alternative configuration, the communication between the electrical energy store (12) and the wireless communication module (18) does not take place directly but via a vehicle control unit, for example a VCU, which is not illustrated in FIG. 1.

Figure 2:
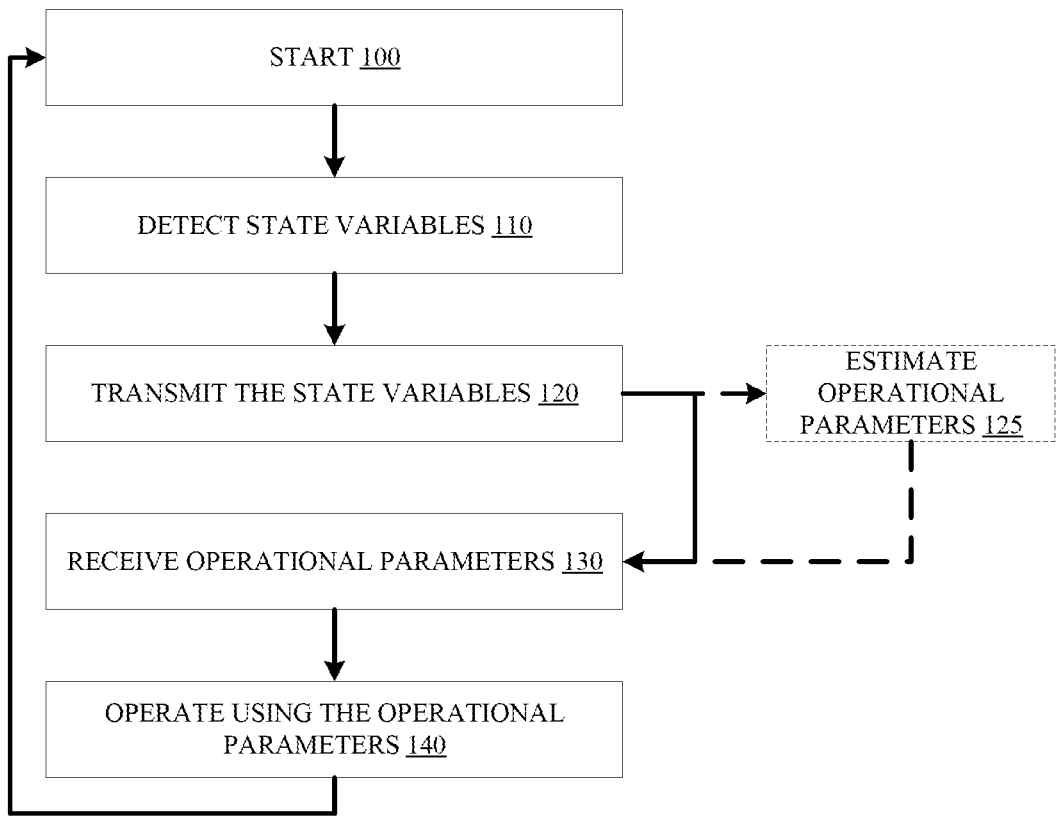
FIG. 2 shows a schematic illustration of the procedure of an exemplary embodiment of the method according to the invention.

FIG. 2 shows a schematic procedure of an exemplary embodiment of the method according to the invention. The exemplary embodiment starts in step 100. Step 110 subsequently follows.

In step 110, the control unit (16) detects state variables of the electrical energy store (12). The detected state variables may be, in particular, a temperature, a voltage, a current and/or a charge. Step 120 subsequently follows step 110.

In step 120, the state variables detected in step 110 are transmitted to the cloud (20) by means of the wireless communication module (18). Step 130 subsequently follows step 120.

In step 130, operating parameters are received by means of the wireless communication module (18), wherein the operating parameters have been determined proceeding from the state variables detected in step 110 and transmitted in step 120. Step 140 subsequently follows step 130.

In step 140, the electrical energy store (12) is operated using the operating parameters received in step 130. Step 100 subsequently follows step 140 again, wherein a delay of a predeterminable period can be provided between step 140 and step 100 being carried out again.

Step 125 can optionally take place between step 120 and step 130. In step 125, the operating parameters are estimated by the cloud (20) proceeding from the transmitted state variables. For this, it is possible that the cloud (20) uses the state variables transmitted in step 120 as input variables for a model, which is suitable for estimating estimated state variables of the electrical energy store from the measured state variables, that is to say, for example, the overall physical state of the electrical energy store is derived proceeding from the detected state variables. Using further models or, for example, also using neural networks, an operating parameter, which may also be, in particular, an estimated state variable, can be determined proceeding from the estimated state variables. In this case, operating parameters may be all physical variables found in operation of the electrical energy store (12). For example, an operating parameter may be the internal resistance of the electrical energy store (12).

Owing to the exemplary embodiment of the method according to the invention that is presented, it is possible to operate the electrical energy store (12) more efficiently since more accurate knowledge about the operating parameters required to operate the electrical energy store (12) can be obtained than would be possible by way of estimation by the control unit (16). The exemplary embodiment of the method according to the invention that is presented can be used, for example, to optimize recuperation, a rapid charging process, a range strategy of the vehicle (10) or a prediction of a remaining service life of the electrical energy store (12).

The invention claimed is:

1. A method for operating an electrical energy store (12), which comprises a storage cell (14) for storing electrical energy and a control unit (16), wherein the control unit (16) is configured to detect state variables of the electrical energy store (12), the method comprising:
   detecting state variables via the control unit (16);
   transmitting the state variables detected by the control unit to a computation unit outside of the electrical energy store (12), wherein the computation unit determines estimated state variables of the electrical energy store (12) using the state variables detected by the control unit (16), and wherein the estimated state variables includes at least one selected from the group consisting of: temperature, current, and electric charge, and
   operating the electrical energy store (12) based on an operating parameter determined by the computation unit using the estimated state variables, wherein the operating parameter is an internal resistance of the electrical store (12).

2. The method as claimed in claim 1, wherein the operating parameter provided by the computation unit are determined using the state variables detected by the control unit (16).

3. The method as claimed in claim 2, wherein the operating parameter is identified using models, wherein the models are suitable for identifying the estimated state variables of the electrical energy store (12) from the detected state variables of the electrical energy store (12) and the operating parameter is identified proceeding from the estimated state variables.

4. The method as claimed in claim 2, wherein the operating parameter provided by the computation unit are identified by means of neural networks.

5. The method as claimed in claim 1, wherein the computation unit is a cloud (20).

6. The method as claimed in claim 5, wherein the electrical energy store (12) is located in a vehicle (10) and a connection between the control unit (16) and the cloud (20) is effected via a wireless communication module (18).

7. The method as claimed in claim 6, wherein the control unit (16) stores values of the operating parameter provided by the cloud (20) and uses these to operate the electrical energy store (12) until updated values of the operating parameter is available from the cloud (20).

8. A device configured to operate an electrical energy store (12), which comprises a storage cell (14) for storing electrical energy and a control unit (16), wherein the control unit (16) is configured to
   detect state variables of the electrical energy store (12);
   transmit the state variables to a computation unit outside of the electrical energy store (12), wherein the computation unit determines estimated state variables of the electrical energy store (12) using the state variables detected by the control unit (16), and wherein the estimated state variables includes at least one selected from the group consisting of: temperature, current, and electric charge; and
   operate the electrical energy store (12) based on an operating parameter determined by the computation unit using the estimated state variables, wherein the operating parameter is an internal resistance of the electrical store (12).

9. A non-transitory, computer-readable medium containing instructions that when executed by a computer cause the computer to control an energy store to
   detect state variables of the electrical energy store (12);
   transmit the state variables to a computation unit outside of the electrical energy store (12), wherein the computation unit determines estimated state variables of the electrical energy store (12) using the state variables detected by the control unit (16), and wherein the estimated state variables includes at least one selected from the group consisting of: temperature, current, and electric charge; and
   operate the electrical energy store (12) based on an operating parameter determined by the computation unit using the estimated state variables, wherein the operating parameter is an internal resistance of the electrical store (12).

10. An electrical energy store (12), which comprises the system as claimed in claim 8.

\* \* \* \* \*